US010522522B2

(12) United States Patent
Song et al.

(10) Patent No.: US 10,522,522 B2
(45) Date of Patent: Dec. 31, 2019

(54) PACKAGE SUBSTRATE COMPRISING SIDE PADS ON EDGE, CHIP STACK, SEMICONDUCTOR PACKAGE, AND MEMORY MODULE COMPRISING SAME

(71) Applicants: Young Hee Song, Seongnam-si (KR); Hyouk Lee, Cheonan-si (KR); Ki Hong Song, Seoul (KR); Jun Hee Jeong, Yongin-si (KR)

(72) Inventors: Young Hee Song, Seongnam-si (KR); Hyouk Lee, Cheonan-si (KR); Ki Hong Song, Seoul (KR); Jun Hee Jeong, Yongin-si (KR); Sung Sik Yun, Seoul (KR)

(73) Assignees: Young Hee Song, Seongnam-si, Gyeonggi-Do (KR); Hyouk Lee, Cheonan-si, Chungcheongnam-Do (KR); Ki Hong Song, Seoul (KR); Jun Hee Jeong, Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/746,100

(22) PCT Filed: Aug. 1, 2016

(86) PCT No.: PCT/KR2016/008434
§ 371 (c)(1),
(2) Date: Jan. 19, 2018

(87) PCT Pub. No.: WO2017/023060
PCT Pub. Date: Feb. 9, 2017

(65) Prior Publication Data
US 2018/0211943 A1 Jul. 26, 2018

(30) Foreign Application Priority Data

Jul. 31, 2015 (KR) .................. 10-2015-0108804
Jul. 31, 2015 (KR) .................. 10-2015-0108808

(51) Int. Cl.
*H01L 25/10* (2006.01)
*H01L 25/065* (2006.01)
*H01L 23/00* (2006.01)

(52) U.S. Cl.
CPC ........ *H01L 25/105* (2013.01); *H01L 25/0657* (2013.01); *H01L 24/03* (2013.01);
(Continued)

(58) Field of Classification Search
CPC ........... H01L 23/5385; H01L 23/49816; H01L 23/13; H01L 23/00; H01L 23/28; H01L 23/488
See application file for complete search history.

(56) References Cited

U.S. PATENT DOCUMENTS 8,053,881 B2 * 11/2011 Kim ...................... H01L 21/563
257/686
2008/0171405 A1 7/2008 Yee et al.
2017/0025385 A1* 1/2017 Song .................. H01L 25/0657

FOREIGN PATENT DOCUMENTS

KR 10-2001-0081699 8/2001
KR 10-1081140 11/2011
(Continued)

OTHER PUBLICATIONS

English translation of the Written Opinion of International Application No. PCT/KR2016/008434, dated Feb. 6, 2018.
(Continued)

*Primary Examiner* — Syed I Gheyas
(74) *Attorney, Agent, or Firm* — Kile Park Reed & Houtteman PLLC

(57) ABSTRACT

The semiconductor package according to the present invention comprises: an integrated substrate; a bottom chip stack, which is mounted on the integrated substrate, has multiple memory semiconductor dies stacked chip-on-chip, and takes
(Continued)

charge of a part of the whole memory capacity; at least one top chip stack, which is mounted on the bottom package, has multiple memory semiconductor dies mounted therein, and takes charge of the rest of the whole memory capacity; an integration wire for electrically connecting the bottom chip stack and the top chip stack(s); and an integration protection member for sealing the integration wire.

3 Claims, 12 Drawing Sheets

(52) U.S. Cl.
CPC .............. *H01L 24/05* (2013.01); *H01L 24/32* (2013.01); *H01L 24/48* (2013.01); *H01L 24/73* (2013.01); *H01L 2224/0331* (2013.01); *H01L 2224/04042* (2013.01); *H01L 2224/32145* (2013.01); *H01L 2224/48091* (2013.01); *H01L 2224/48145* (2013.01); *H01L 2224/48227* (2013.01); *H01L 2224/49176* (2013.01); *H01L 2224/73265* (2013.01); *H01L 2225/0651* (2013.01); *H01L 2225/06506* (2013.01); *H01L 2225/06548* (2013.01); *H01L 2225/06555* (2013.01); *H01L 2225/06562* (2013.01); *H01L 2225/06586* (2013.01); *H01L 2225/1023* (2013.01); *H01L 2225/1052* (2013.01); *H01L 2225/1058* (2013.01); *H01L 2924/1436* (2013.01); *H01L 2924/37001* (2013.01)

(56) References Cited

FOREIGN PATENT DOCUMENTS

KR 10-2012-0006352 1/2012
KR 10-2014-0110052 9/2014

OTHER PUBLICATIONS

International Search Report for International Application No. PCT/KR2016/008434, dated Dec. 7, 2016.

\* cited by examiner

PACKAGE SUBSTRATE COMPRISING SIDE PADS ON EDGE, CHIP STACK, SEMICONDUCTOR PACKAGE, AND MEMORY MODULE COMPRISING SAME

TECHNICAL FIELD

The present invention relates to a package substrate including side pads on an edge, a chip stack, and a semiconductor package, and a memory module, and more particularly, to a semiconductor package in which, with a trend of standardization of solid-state drive (SSD), it is necessary to provide a high-capacity and high-speed service despite slimness and miniaturization of a package, a land grid array (LGA) type NAND flash memory semiconductor package which is most suitable to the above service is realized, packaging is firstly performed using divided chip stacks even when memory capacity required in the future increases twice, multiple types of memory chip stacks are integrally packaged in a method in which respect substrates are bonded by wire bonding using side pads on a side surface of an LGA package substrate, and thus requirements of slimness and miniaturization are satisfied even when the same area is used.

BACKGROUND ART

Recently, as functions of electronic products are increased and the electronic products are made in a small size, technology in which more semiconductors are mounted in the same area is required. Therefore, the miniaturization of electronic portable devices and various functions of mobile products cannot be satisfied only by simple chip stacking technology or package stacking technology.

FIG. 1 is a side view illustrating a configuration of a conventional 16-stage multi-chip package (MCP).

Referring to FIG. 1, one or more dies 14 are stacked inside a conventional semiconductor NAND flash memory package 10. However, in consideration of mass productivity, the number of dies 14 that can be stacked is largely limited. The fact causes capacity limitations in implementing a high-capacity semiconductor NAND flash memory.

Nevertheless, when a 16-stage stack is formed in view of a high-capacity memory trend, an electrical characteristic in an upper die 14, which is relatively far from a substrate 12, is degraded and can cause a yield reduction, resulting in a problem that an entire length of a bonding wire 16 is increased.

Meanwhile, package on package (PoP) technology is introduced to improve the yield reduction.

FIG. 2 is a side view illustrating a configuration of a conventional ball grid array (BGA) PoP.

Referring to FIG. 2, since a PoP package 20 connects packages by a BGA, demands for slimness and miniaturization of a solid-state drive (SSD) by solder balls 22 cannot be realized.

DISCLOSURE

Technical Problem

The present invention is directed to providing a semiconductor package in which demands for high capacity and slimness may be realized.

The present invention is directed to providing a semiconductor package in which memory semiconductor dies are vertically arranged and an electrical characteristic may be maintained while a height of the package is minimized even when memory capacity is increased.

Technical Solution

One aspect of the present invention provides a semiconductor package. The semiconductor package includes an integrated substrate, a bottom chip stack, which is mounted on the integrated substrate, has a plurality of memory semiconductor dies stacked chip-on-chip, and takes charge of a part of whole memory capacity, at least one top chip stack, which is mounted on the bottom package, has a plurality of memory semiconductor dies stacked thereon, and takes charge of a remaining part of the whole memory capacity, an integration wire configured to electrically connect the bottom chip stack to the top chip stack, and an integration protective member configured to seal the integration wire.

Another aspect of the present invention provides a chip stack. The chip stack includes a substrate having an upper surface on which a substrate pad and a side pad are printed, a plurality of memory semiconductor dies of a multi-chip package type, a connecting member configured to electrically connect the memory semiconductor dies, and a bottom protective member configured to cover the memory semiconductor dies, the entire connecting member, and a part of the substrate.

Still another aspect of the present invention provides a package substrate. The package substrate includes an insulating printed circuit board (PCB) body, an upper wiring pattern configured to print a substrate pad inside an upper surface of the PCB body and print a side pad on an upper edge of the PCB body, and a rewiring pattern configured to electrically connect the substrate pad to the side pad inside the PCB body.

Advantageous Effects

According to a configuration of the present invention, the following effects can be expected.

First, since memory semiconductor dies are not forcedly vertically arranged but are divided into a plurality of chip stacks and packaged, yield reduction caused by vertical stacking of the semiconductor dies can be fundamentally prevented.

Second, since a substrate is inserted into the middle between a plurality of memory semiconductor dies and the divided packages are electrically connected on side surface of each of the substrates by wire bonding, a length of a conductive wire is fundamentally reduced, and an effect of facilitating the wire bonding process is expected.

Third, since each substrate is inserted and interposed between the plurality of memory semiconductor dies, heat generated in the high-capacity memory semiconductor dies is effectively dispersed, and an effect of preventing a thermal characteristic from being degraded is expected.

MODES OF THE INVENTION

Figure 1:
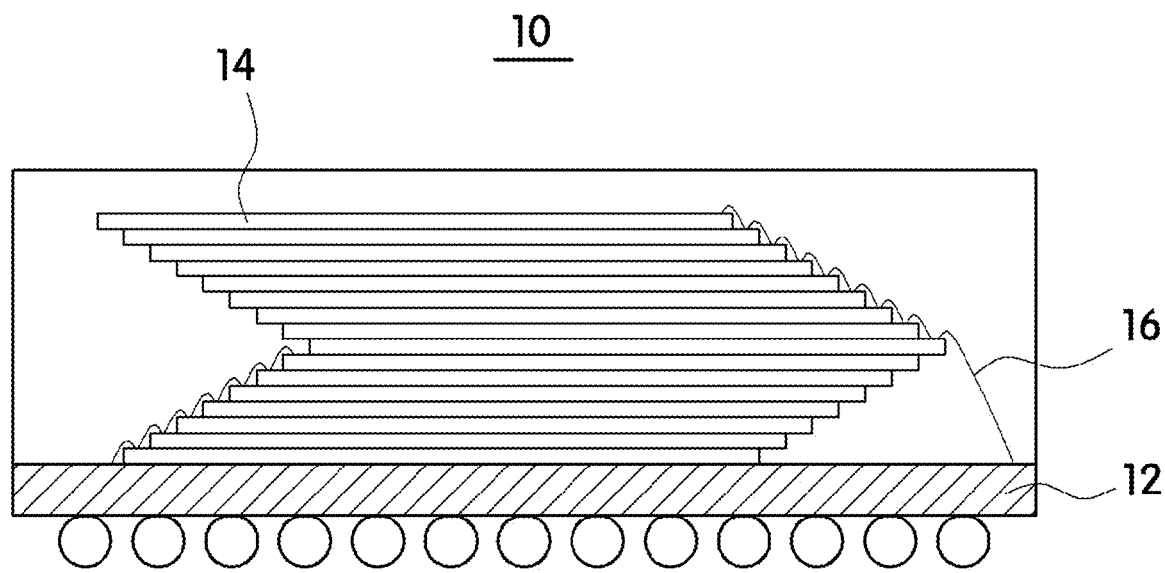
FIG. 1 is a side view illustrating a configuration of a conventional 16-stage multi-chip package (MCP).
Figure 2:
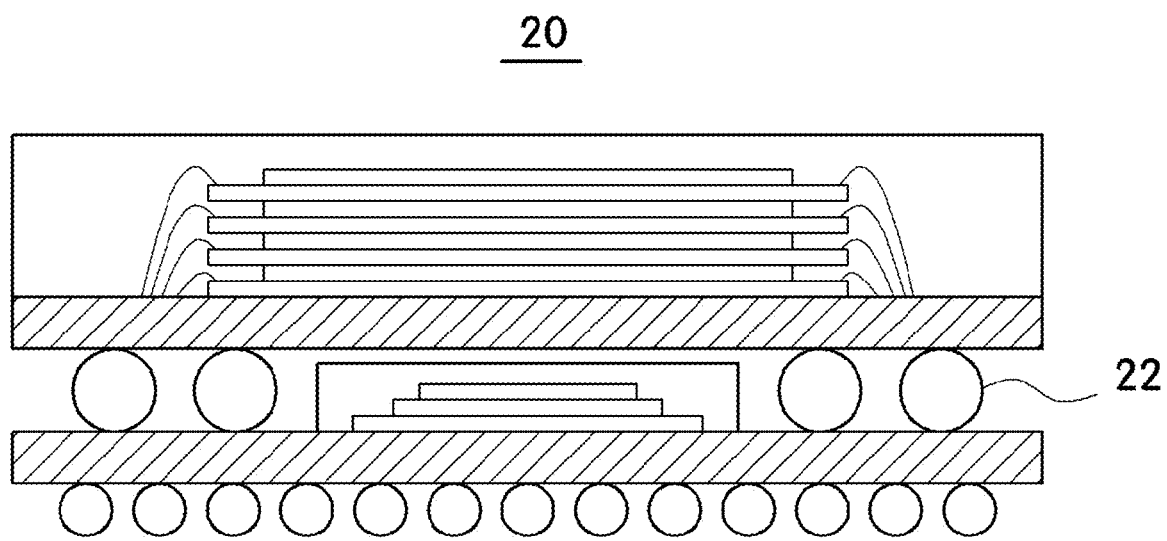
FIG. 2 is a side view illustrating a configuration of a conventional ball grid array (BGA) package on package (PoP).
Figure 3:
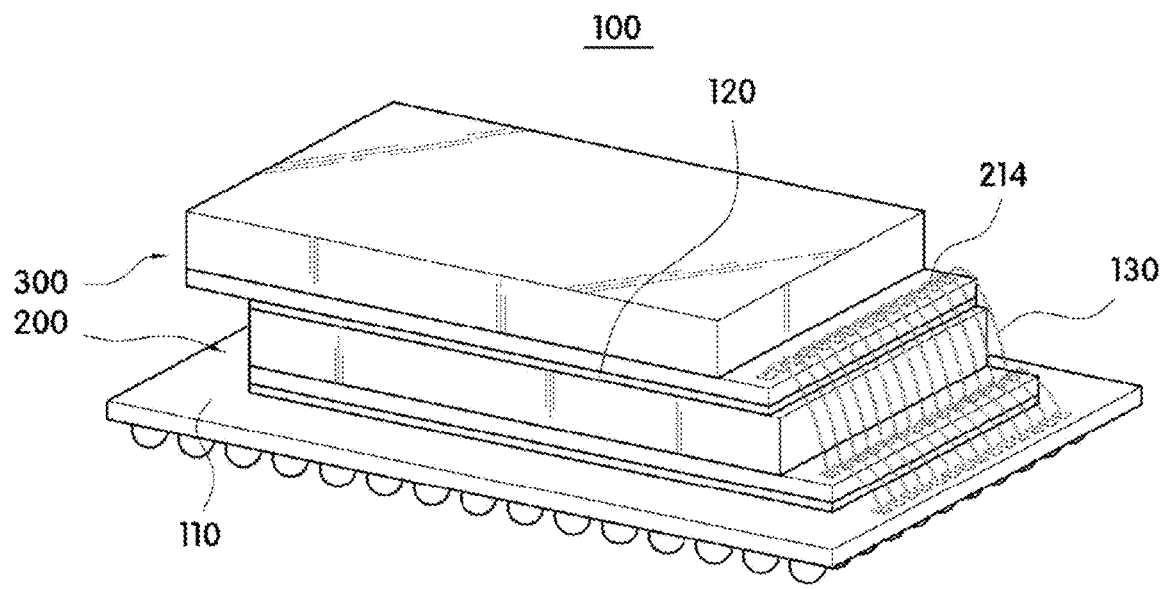
FIG. 3 is a perspective view illustrating a configuration of a land grid array (LGA) semiconductor package according to the present invention.

Advantages and characteristics of the present invention and a method of achieving the advantages and characteristics will be clear by referring to exemplary embodiments described below in detail together with the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims. In the drawings, a size and a relative size of a layer or an area may be exaggerated for clarity of description. Like reference numerals indicate like components throughout the specification.

The exemplary embodiments of the invention will be described with reference to plan views and cross-sectional views, which are ideal schematic views. Forms of the exemplary views may be modified by the manufacturing technology and/or tolerance. Therefore, the embodiments of the invention are not intended to be limited to illustrated specific forms, but include modifications of forms generated according to the manufacturing processes. Therefore, areas illustrated in the drawings have outline properties, shapes of the areas are to illustrate special forms of the areas of a device, and are not intended to limit the scope of the invention.

Hereinafter, a preferred embodiment of a land grid array (LGA) semiconductor package having the above-described configuration according to the present invention will be described in detail with reference to the accompanying drawings.

For example, in the LGA semiconductor package of the present invention, a NAND flash memory semiconductor die of a 16-stage chip stack is divided and packaged into four packages of a 4-stage chip stack, and the four packages are then packaged on an integrated substrate again.

When a high-capacity stacked memory semiconductor die is finally packaged while being divided and packaged as described above, an electrical characteristic may be maintained while addressing a problem of yield reduction due to the high-capacity stacking.

Referring to FIGS. 1 to 6, an LGA semiconductor package 100 of the present invention includes an integrated substrate 110, a divided bottom chip stack 200, which is mounted on the integrated substrate 110, has a plurality of memory semiconductor dies 220 stacked chip on chip, and takes charge of a part of whole memory capacity, a divided top chip stack 300, which is mounted on the bottom chip stack 200 using an adhesive member 120, has a plurality of memory semiconductor dies 220 stacked thereon, and takes charge of a remaining part of the whole memory capacity, an integration wire 130 configured to electrically connect the bottom and top chip stacks 200 and 300, and an integration protective member 140 configured to seal the integration wire 130.

Figure 7A:
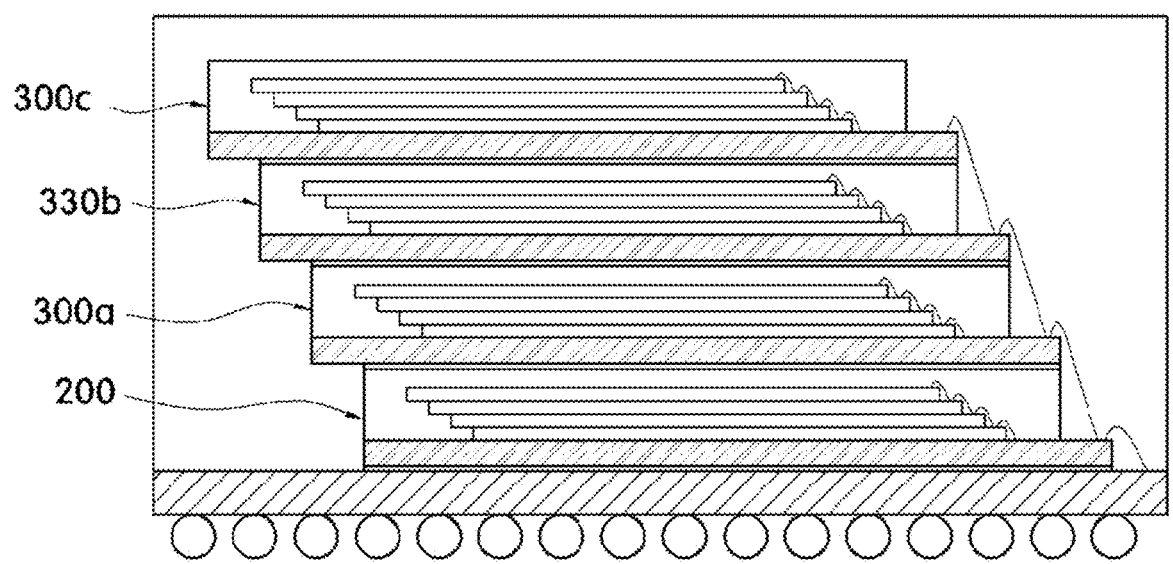
FIGS. 7A and 7B are side views illustrating a configuration of an LGA semiconductor package including four 4-stage chip stacks as a rigid package and a flexible package according to an embodiment of the present invention.
Figure 8A:
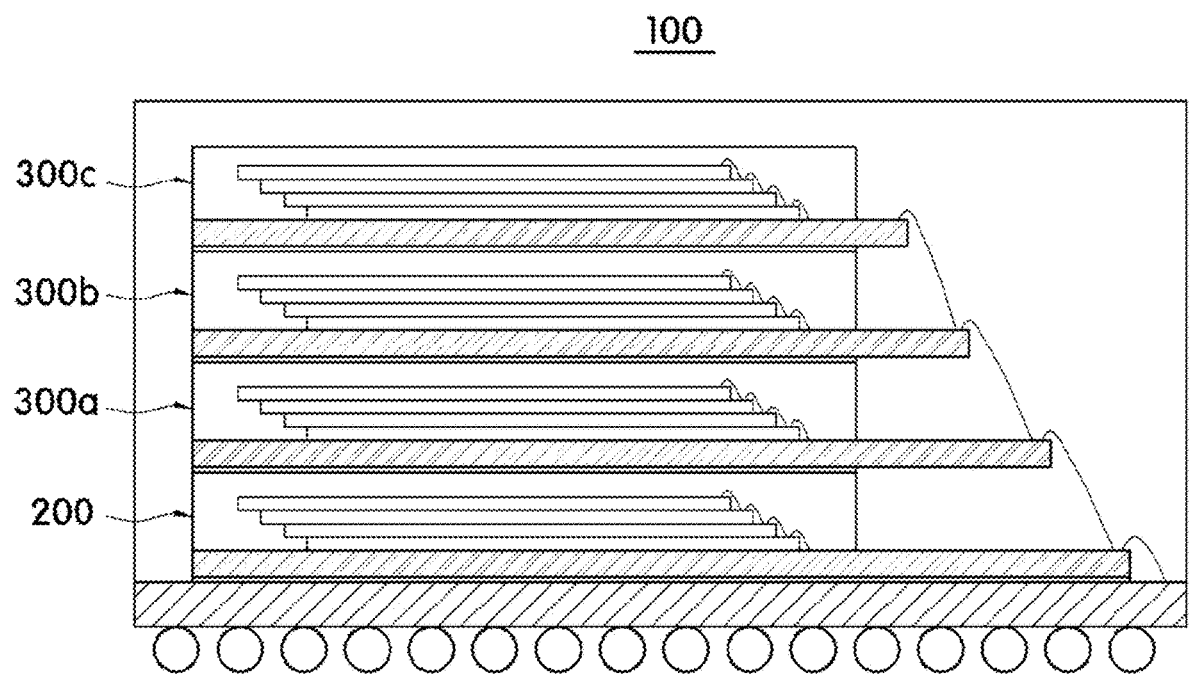
FIGS. 8A and 8B are side views illustrating a configuration of an LGA semiconductor package including four 4-stage chip stacks as a rigid package and a flexible package according to another embodiment of the present invention.

In the embodiment of the present invention, the LGA semiconductor package 100 is divided into the bottom chip stack 200 and the top chip stack 300. However, when the above-described package may be bonded in plural, it is assumed that the above-described package includes at least two packages and preferably, the above-described package may be divided into four packages as illustrated in FIGS. 7A and 8A. For example, the chip stacks may be divided into first to fourth chip stacks 200, 300*a*, 300*b*, and 300*c*.

However, for convenience of description, at least one package provided on the integrated substrate 110 is referred to as the bottom chip stack 200, and at least one package bonded on the bottom chip stack 200 is referred to as the top chip stack 300.

Figure 6:
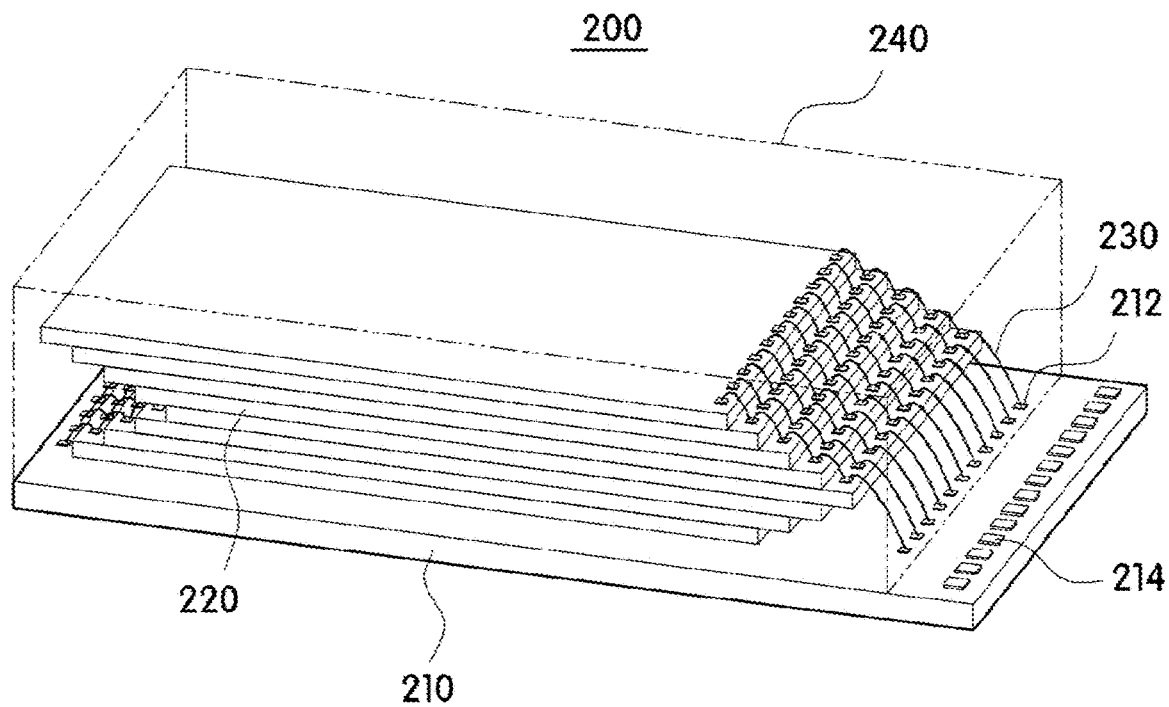
FIG. 6 is a perspective view illustrating a configuration of a chip stack according to the present invention.

Specifically, referring to FIG. 6, the bottom chip stack 200 includes a bottom substrate 210, a plurality of memory semiconductor dies 220 stacked on the bottom substrate 210 chip on chip, a connecting member 230 of a through electrode or a bonding wire, which electrically connects the plurality of memory semiconductor dies 220, and a bottom protective member 240 configured to cover the bottom substrate 210 and the semiconductor dies 220.

The bottom substrate 210 includes an insulating printed circuit board (PCB) body (not illustrated), an upper wiring pattern (not illustrated) including substrate pads 212 and side pads 214 on an upper surface of the PCB body, a lower wiring pattern (not illustrated) including external connection terminals on a bottom surface of the PCB body, and a through electrode and/or a rewiring pattern (not illustrated) configured to connect the substrate pads 212 to the external connection terminals or configured to electrically connect the substrate pads 212 to the side pads 214 inside the PCB body.

Figure 7B:
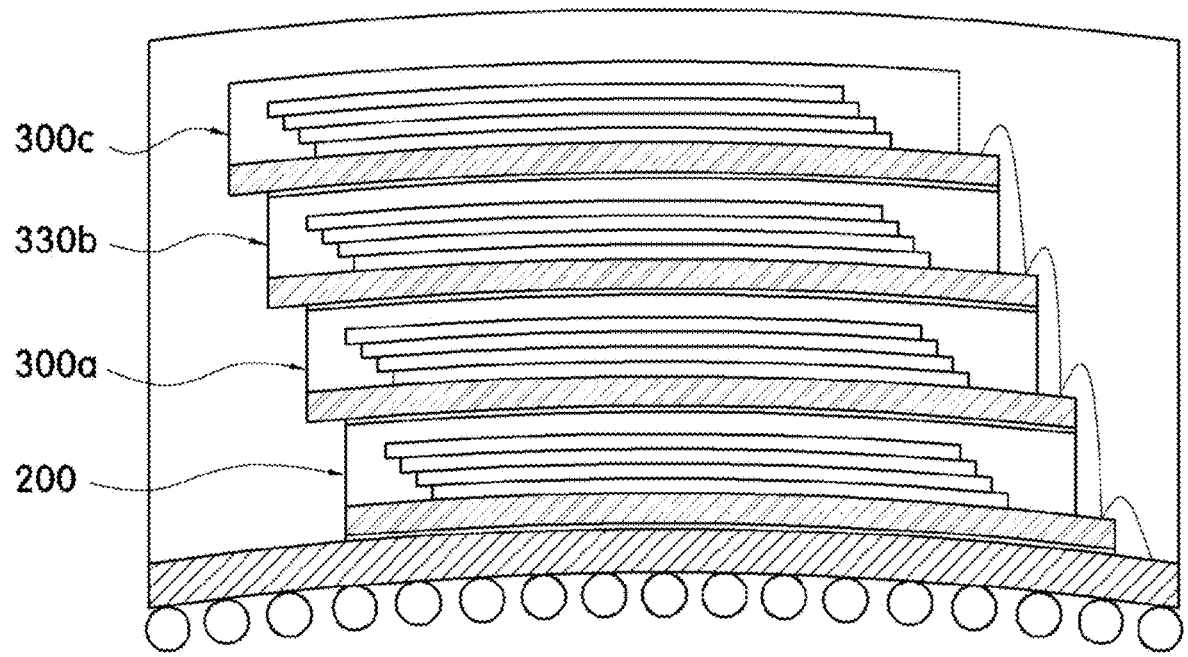
Figure 8B:
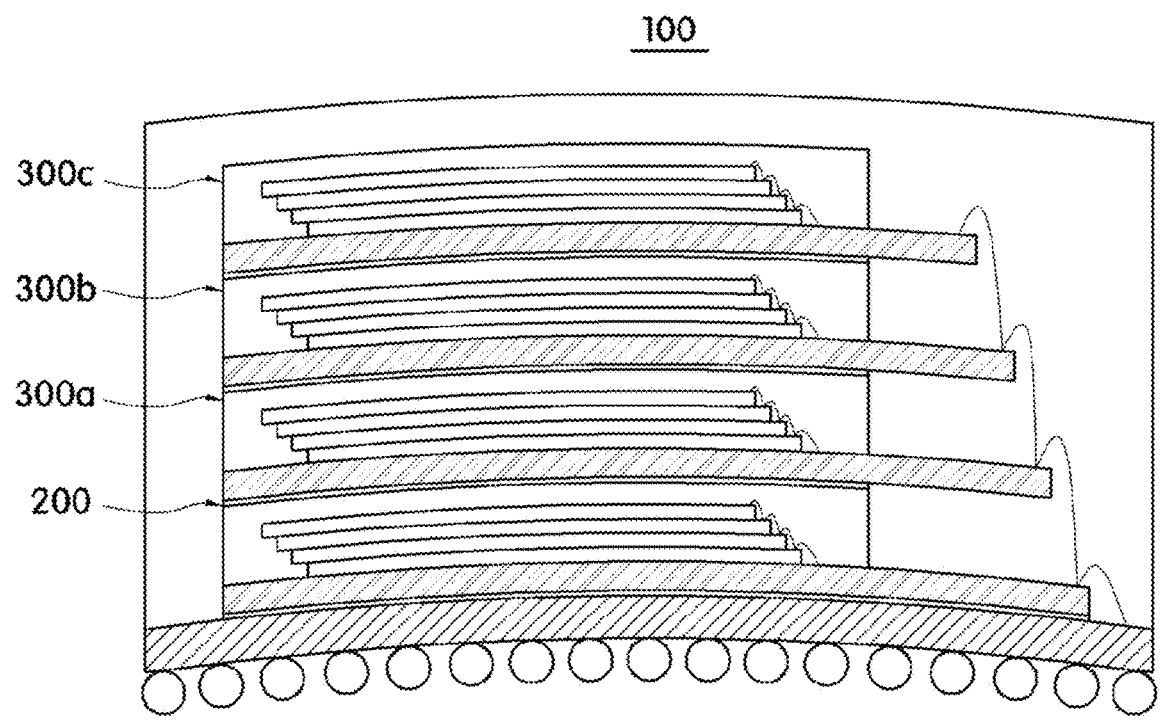

The insulating PCB body of the present invention may include a flexible FPCB substrate. For example, recently, as freely curved flexible semiconductor substrates and semiconductor dies are being developed, and further, as flexible semiconductor packages that are freely curved, including the above-described substrates and dies are being developed, the insulating PCB body may be formed using a FPCB. That is, the flexible LGA semiconductor package may be implemented through a flexible substrate, a flexible die, a flexible wire, and a flexible molding (see FIGS. 7B and 8B).

For example, the bottom chip stack 200 may be formed as a flexible semiconductor package. To this end, the bottom substrate 210 may be curved or bent. To this end, the bottom substrate 210 may be formed of a polymer material. For example, the flexible substrate may be representatively formed of polyimide (PI), polyester, polyethylene naphthalate (PEN), Teflon, polyethylene terephthalate (PET), or other polymeric materials.

The substrate pads 212 may be formed on the bottom substrate 210, and may include a flexible material such as copper (Cu), titanium (Ti), aluminum (Al), or a metal alloy to form a conductive film capable of being curved. The substrate pads 212 may include a conductive metal wiring formed by a deposition process using a lithography method and an etching process. For the sake of flexibility, the substrate pads 212 may include a conductive metal wiring formed by printing a conductive ink using a printing method.

Elements of the memory semiconductor dies 220 are integrated on a silicon substrate, but a thickness of the silicon substrate is not more than several tens of micrometers so that the silicon substrate may be curved.

Meanwhile, an adhesive member (not illustrated) which bonds the memory semiconductor dies 220 requires a material which includes an excellent adhesive polymer material to have strong adhesion, so that the bottom substrate 210 and the semiconductor dies 220 are not detached or separated even when the bottom substrate 210 is curved or bent.

The bottom protective member 240 may be formed of a material to be curved or bent. For example, the bottom protective member 240 may include a material capable of providing stress, and may include a polymer material or a rubber material. Specifically, the bottom protective member 240 may include PI.

Therefore, the semiconductor package 200 may be flexible and expanded or contracted even when the semiconductor package 200 is arbitrarily curved or bent, and damage of the semiconductor package 200 due to stress may be prevented even when stress occurs due to expansion and contraction. Specifically, since the substrate pads 212 formed on the bottom substrate 210 are not cut or detached from the bottom substrate 210 while the bottom substrate 210 is bent or stretched, functional damage of the bottom protective member 240 due to a contact fail may be prevented.

Meanwhile, in the present invention, the substrate pads 212 are directly connected to the side pads 214 using a rewiring pattern. Therefore, in some embodiments, the external connection terminals may be omitted.

The bottom chip stack 200 may be formed as a conventional semiconductor package in which various types of memory semiconductor dies are stacked on the bottom substrate 210 in various forms. Here, the multi-layer memory semiconductor dies may take the form of a multi-chip package (MCP) as follows.

Figure 4:
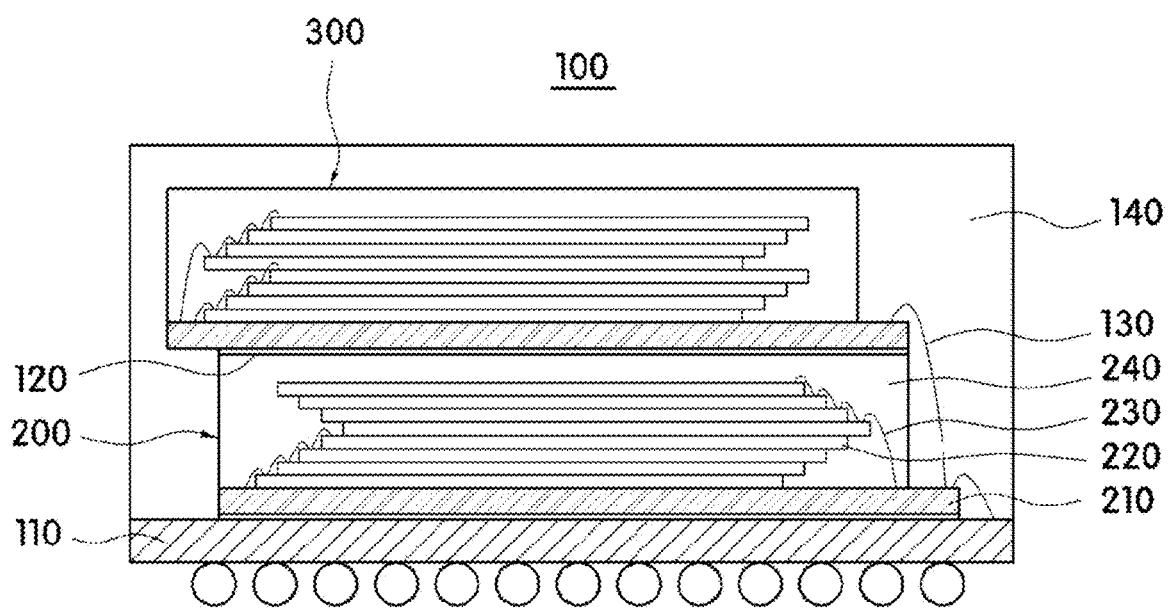
FIGS. 4 and 5 are side views of FIG. 3 according to embodiments of various MCPs.
Figure 5:
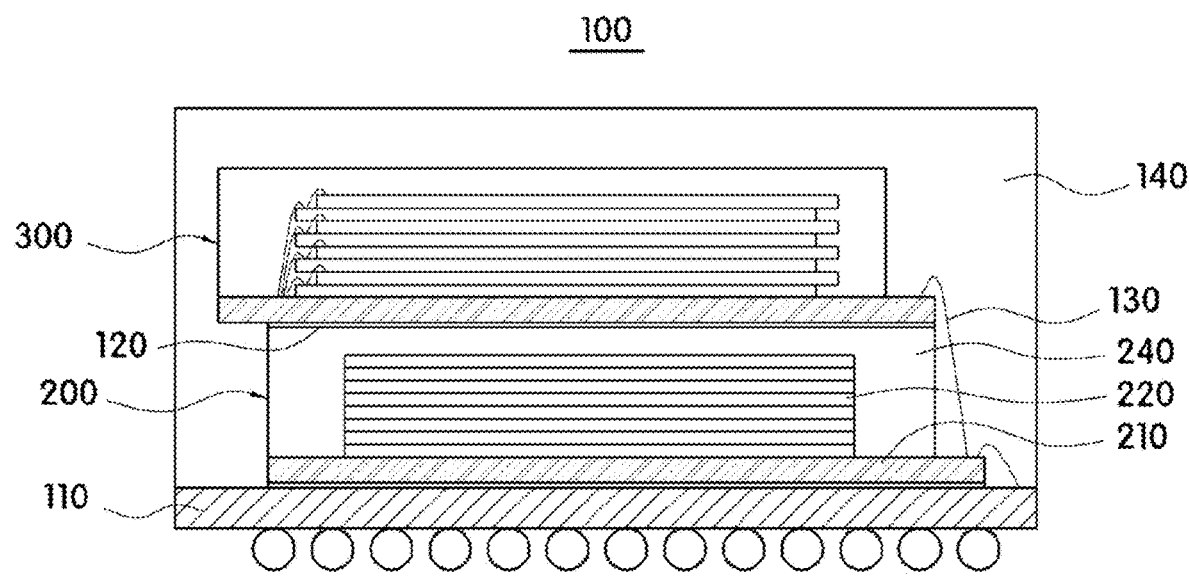

The memory semiconductor dies 220 may be stacked in a step form as illustrated in FIG. 4 or may be vertically stacked (see reference numeral 200) or in a zigzag form (see reference numeral 300) as illustrated in FIG. 5, and it is assumed that the memory semiconductor dies do not exceed an 8-stage stack in order to prevent degradation of an electrical characteristic due to a high-speed operation. However, it is not excluded that some planar arrays are coupled, and various array forms may be determined in consideration of a size of a solid-state drive (SSD) and a memory capacity. Further, the memory semiconductor dies 220 do not interfere with being arranged with logic semiconductor dies.

Referring to FIG. 5, in the case in which a through electrode (not illustrated) is used for electrical connection of the memory semiconductor dies 220 stacked on the chip stack 300 without wire bonding, when the semiconductor dies vertically stacked are to be vertically aligned, the semiconductor dies 220 may be designed so as to be vertically stacked.

As described above, the bottom substrate 210 of the present invention further includes side pads 214 for electrically connecting to the top chip stack 300 at an edge in which the memory semiconductor dies 220 are not bonded. The side pads 214 are areas in which the top chip stack 300 and the bottom chip stack 200 are electrically connected by the integration wire 130 and are also areas which are connected to the respective semiconductor dies 220 through a rewiring line (RDL).

In the present invention, since the top chip stack 300 and the bottom chip stack 200 are connected at one side of the top chip stack 300 and the bottom chip 200 stack by the integration wire 130 in an LGA type, a plurality of packages are not connected by a ball grid array (BGA) so that an increase of a height of the package may be prevented and the package may be slimmed.

Further, since the plurality of packages are separated and configured into divided top stacks, a length of the conductive wire may be reduced and an electrical characteristic may be maintained despite a high-speed operation. For example, each bottom substrate 210 is interposed between the plurality of memory semiconductor dies 220 and serves as a terminal through which the conductive wire passes. As a result, the length of the conductive wire may be prevented from being increased.

The side pads 214 are connected to the RDL of the bottom substrate 210 and are electrically connected to the plurality of memory semiconductor dies 220 stacked on the bottom substrate 210. The chip stacks 200 and 300 may be connected through the integration wire 130, and the bottom chip stack 200 and the integrated substrate 110 may be connected using the existing external connection terminal.

Rather, in the embodiment of the present invention, an external contact terminal for electrically connecting the bottom chip stack 200 to the outside may be omitted without being provided at a lower portion of the semiconductor package. For example, when the side pads 214 and the plurality of memory semiconductor dies 220 are connected by the RDL, a height of the semiconductor package may be significantly reduced by not placing the external contact terminal at the lower portion of the semiconductor package.

As a result, since each bottom substrate 210 is inserted between the plurality of memory semiconductor dies 220, heat generated in the memory semiconductor dies 220 may be effectively discharged through each bottom substrate 210 having excellent thermal conductivity and a thermal characteristic may be improved.

As described above, when the bottom chip stack 200 and the top chip stack 300 are separately configured, a function of a corresponding package may be independently designed, any type of semiconductor die may be stacked regardless of types of the semiconductor dies packaged in the corresponding package, and thus this fact may further lead to reach package generalization.

Figure 9:
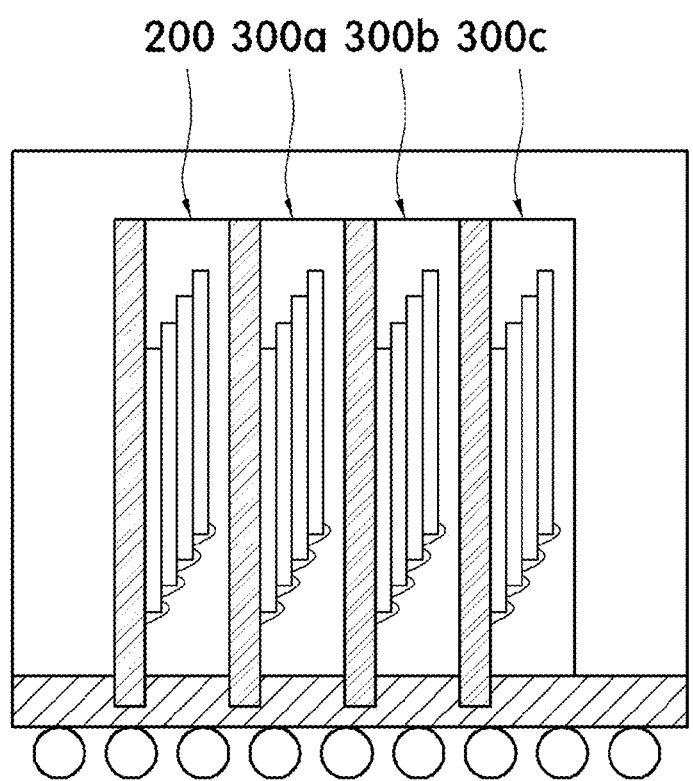
FIG. 9 is a side view illustrating a configuration of an LGA semiconductor package including four 4-stage chip stacks according to still another embodiment of the present invention.

Since the memory semiconductor dies of the present invention are divided and packaged into a plurality of chip stacks by LGA packaging and the LGA chip stacks can be electrically connected using side pads provided in a side space of the LGA package substrate without wire bonding, it is not necessary to assert only vertical arrangement of the memory semiconductor dies, and various types of divided chip stacks that can be generalized as illustrated in FIG. 9 may be assembled to the LGA package substrate in various methods.

For example, in a BGA semiconductor stack package of the present invention, a dynamic random access memory (DRAM) semiconductor die of a 16-stage chip stack is divided and packaged into four packages of a 4-stage chip stack, and the four packages are then packaged on an integrated substrate again.

When a high-capacity stacked memory semiconductor die is finally packaged while being divided and packaged as described above, an electrical characteristic may be maintained while addressing a problem of yield reduction due to the high-capacity stacking.

Figure 10:
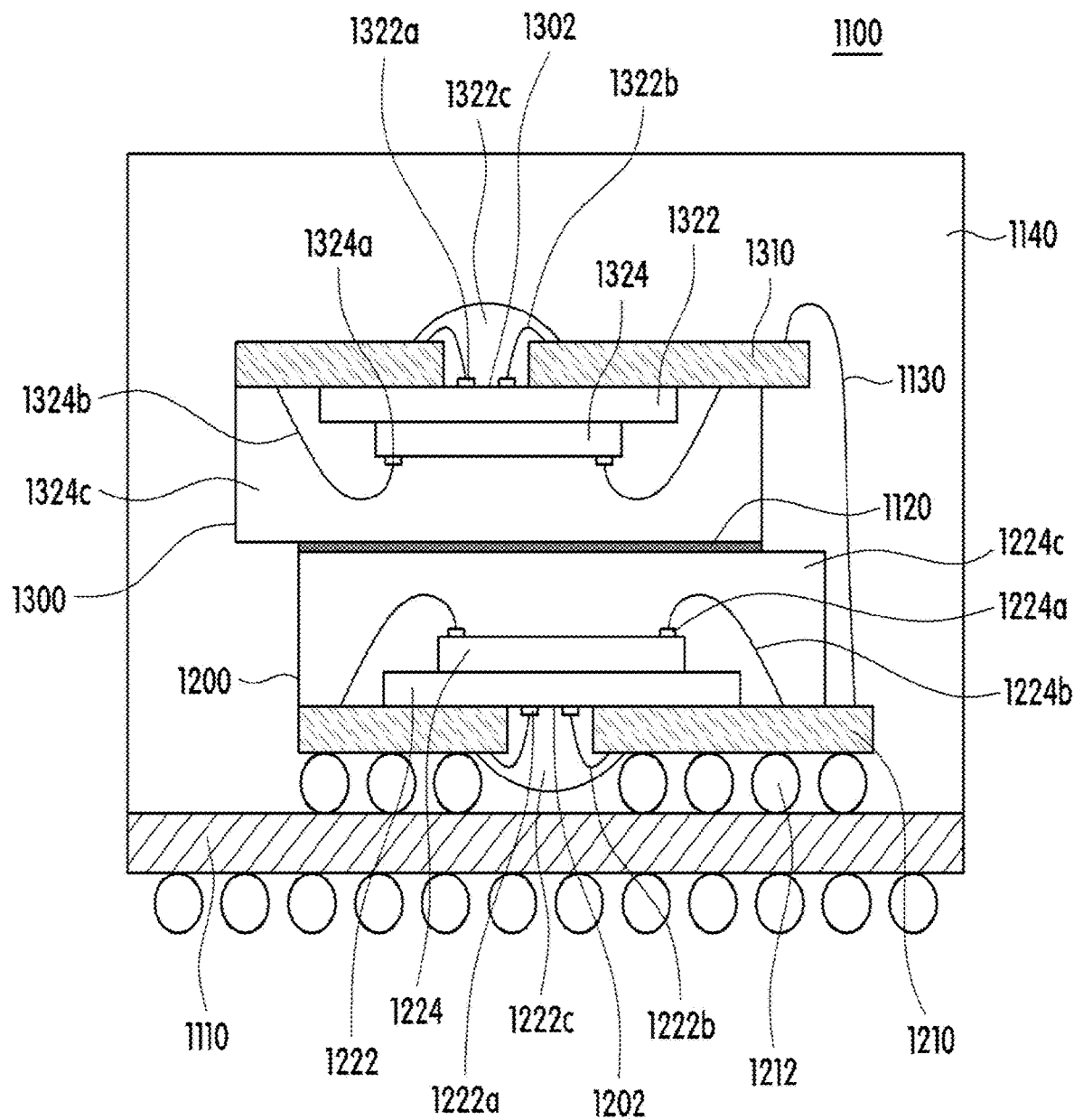
FIGS. 10 to 12 are side views respectively illustrating configurations in which side pads according to the present invention are applied to board on chip (BOC) packages.

Referring to FIG. 10, a board on chip (BOC) semiconductor stack package 1100 of the present invention includes an integrated substrate 1110, a divided bottom BOC package 1200 attached to the integrated substrate 1110, a divided top BOC package 1300 stacked on the bottom BOC package 1200 through an adhesive member 1120, an integration wire 1130 configured to electrically connect the bottom and top BOC packages 1200 and 1300, and an integration protective member 1140 configured to seal the integration wire 1130.

The bottom BOC package 1200 includes a bottom substrate 1210 having a window 1202 at a center thereof, a first chip 1222 bonded to the bottom substrate 1210 so that the bottom substrate 1210 faces an active surface of the first chip 1222 and having a first bonding pad 1222a exposed downward through the window 1202, and a second chip 1224 having an inactive surface bonded to an inactive surface of the first chip 1222 and an active surface on which a second bonding pad 1224a is formed at one side of the active surface.

The first bonding pad 1222a is bonded to a bottom surface of the bottom substrate 1210 through the window 1202 by wire bonding, and the first bonding pad 1222a and a first bonding wire 1222b are molded by a first protective member 1222c.

The second bonding pad 1224a is bonded to an upper surface of the bottom substrate 1210 by wire bonding, and the second bonding pad 1224a and a second bonding wire 1224b are molded by a second protective member 1224c. Solder balls 1212 are formed on the bottom surface of the bottom substrate 1210.

The top BOC package 1300 includes a top substrate 1310 having a window 1302 at a center thereof, a first chip 1322 bonded to the top substrate 1310 so that the top substrate 1310 faces an active surface of the first chip 1322 and having a first bonding pad 1322a exposed downward (toward an upper portion in the drawing) through the window 1302, and a second chip 1324 having an inactive surface bonded to an inactive surface of the first chip 1322 and an active surface on which a second bonding pad 1324a is formed at one side of the active surface.

The first bonding pad 1322a is bonded to a bottom surface of the top substrate 1310 through the window 1302 by wire bonding, and the first bonding pad 1322a and a first bonding wire 1322b are molded by a first protective member 1322c.

The second bonding pad 1324a is bonded to an upper surface of the top substrate 1310 by wire bonding, and the second bonding pad 1324a and a second bonding wire 1324b are molded by a second protective member 1324c. Since the integration wire 1130 is provided on the bottom surface of the top substrate 1310, a separate solder ball is not formed.

Above all, side pads (not illustrated) are further included in edge areas of the bottom substrate 1210 and the top substrate 1310, which are not covered by the second protective member 1224c and the second protective member 1324c, and thus the integration wire 1130 connects between the side pads to electrically connect the top BOC package 1300 to the bottom BOC package 1200.

Meanwhile, in the memory semiconductor stack package of the present invention, it is intended to provide a flexible memory package so that the memory semiconductor stack package is applied to a wearable device in which high capacity and high specification are required.

For example, the bottom BOC package 1200 may be formed as a flexible semiconductor package. To this end, the bottom substrate 1210 may be curved or bent. To this end, the bottom substrate 1210 may be formed of a polymer material. For example, the flexible substrate may be representatively formed of PI, polyester, PEN, Teflon, PET, or other polymeric materials.

The first bonding pad 1222a formed on the bottom substrate 1210 may include a flexible material such as copper (Cu), titanium (Ti), aluminum (Al), or a metal alloy to form a conductive film capable of being curved. The first bonding pad 1222a may include a conductive metal wiring formed through a deposition process by a lithography method and an etching process. For the sake of flexibility, the first bonding pad 1222a may include a conductive metal wiring formed by printing a conductive ink by a printing method.

Elements of the memory first chip 1222 or the second chip 1224 are integrated on a silicon substrate, but a thickness of the silicon substrate is not more than several tens of micrometers so that the silicon substrate may be curved.

Meanwhile, an adhesive member (not illustrated) which bonds the first chip 1222 or the second chip 1224 requires a material which includes an excellent adhesive polymer material to have strong adhesion so that the bottom substrate 1210 and a chip 1220 are not detached or separated even when the bottom substrate 1210 is curved or bent.

The second protective member 1224c may be formed of a material to be curved or bent. For example, the second protective member 1224c may include a material capable of providing stress, and may include a polymer material or a rubber material. Specifically, the second protective member 1224c may include PI.

Therefore, the second protective member 1224c may be flexible and expanded or contracted even when the bottom BOC package 1200 is arbitrarily curved or bent, and damage of the second protective member 1224c due to stress may be prevented even when stress occurs due to expansion and contraction. Specifically, since the first bonding pad 1222a formed on the bottom substrate 1210 is not cut or detached from the bottom substrate 1210 while the bottom substrate 1210 is bent or stretched, functional damage of the second protective member 1224c due to a contact fail may be prevented.

Figure 11:
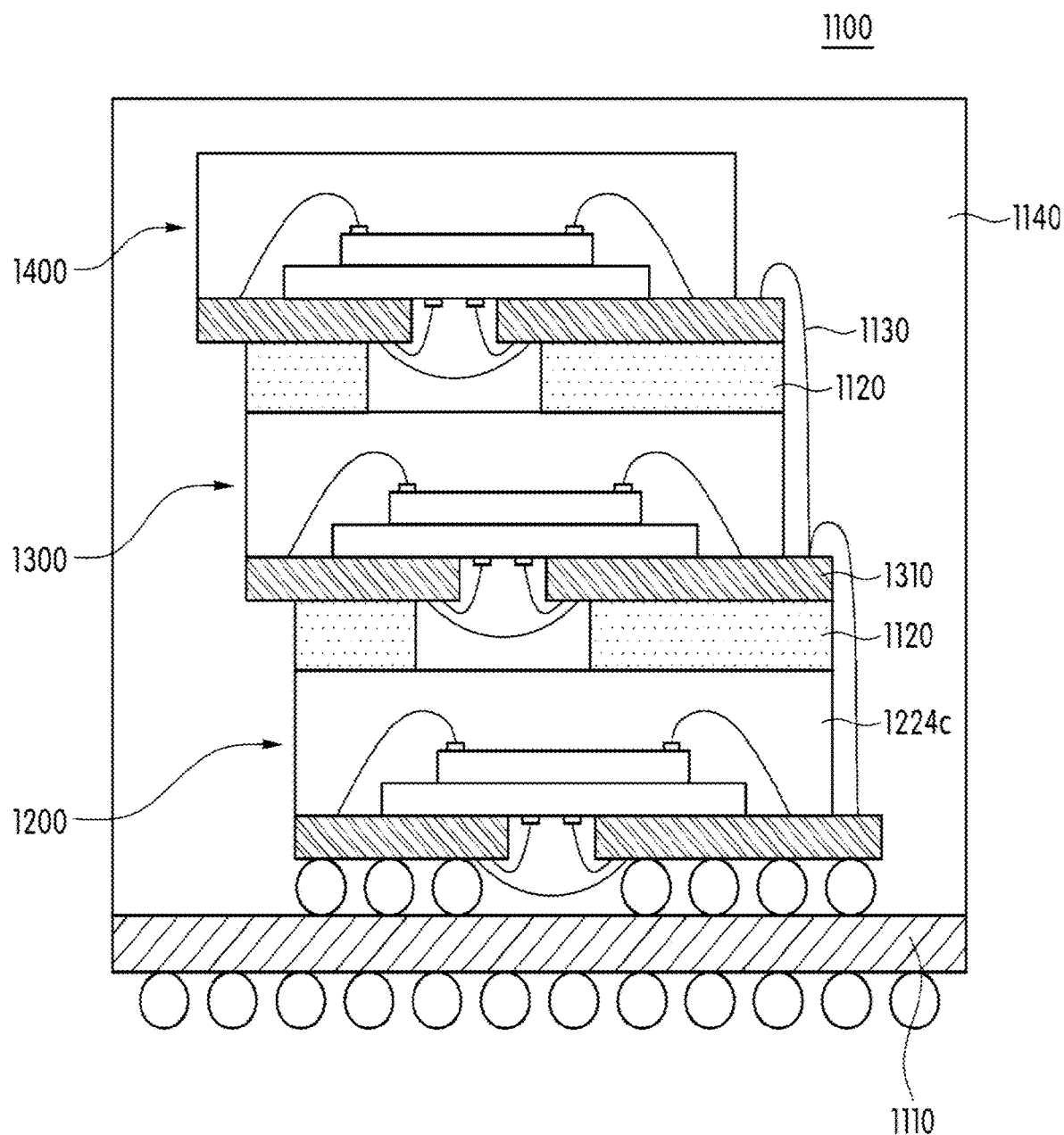

Referring to FIG. 11, a BOC semiconductor stack package 1100 according to another embodiment of the present invention includes an integrated substrate 1110, a divided first BOC package 1200, a divided second BOC package 1300 stacked on the first BOC package 1200 through a first spacer 1120, a divided third BOC package 1400 stacked on the second BOC package 1300 through a second spacer 1120, an integration wire 1130 configured to electrically connect the first to third packages 1200 to 1400, and an integration protective member 1140 configured to seal the integration wire 1130.

In this case, the first and second spacers 1120 provide a space between a protective member 1224c of the first BOC package 1200 and a substrate 1310 of the second BOC package 1300 and perform a function for bonding the two packages 1200 and 1300.

Figure 12:
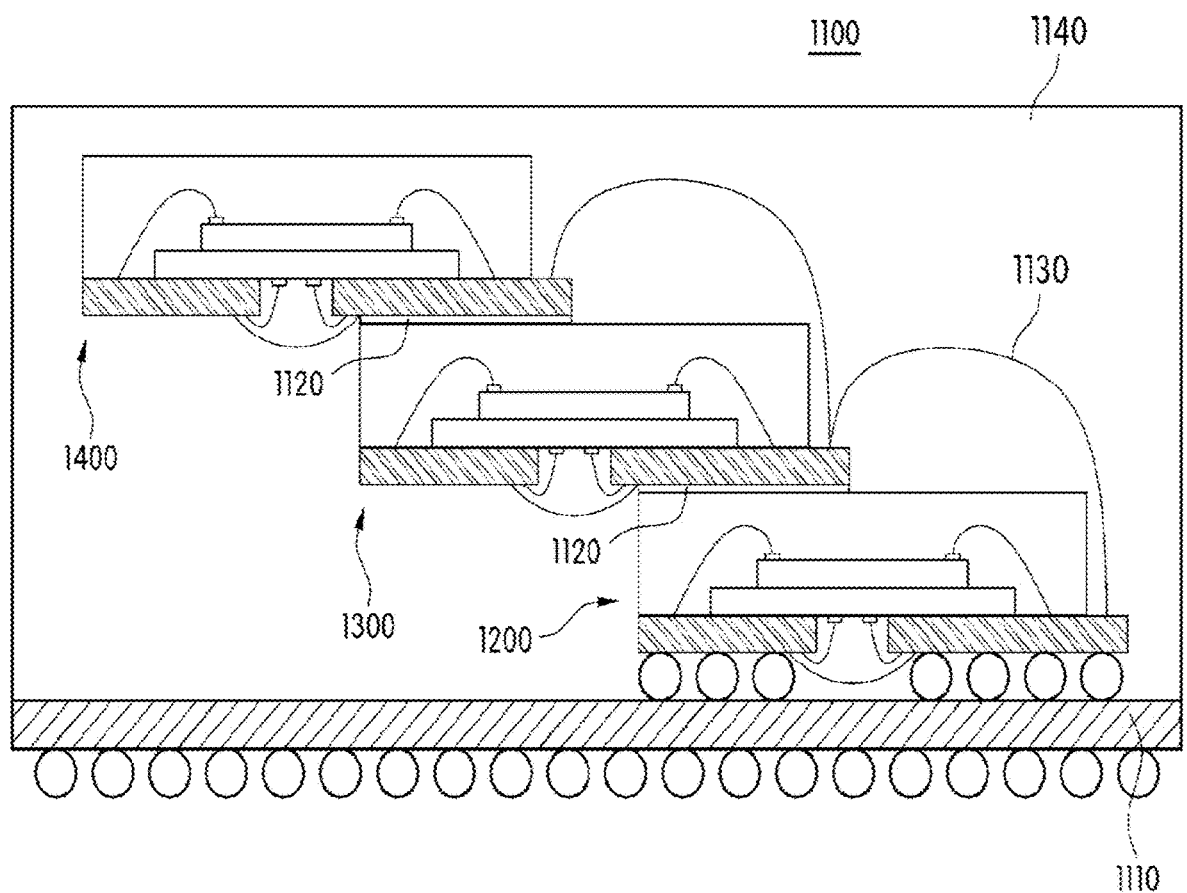

Referring to FIG. 12, a BOC semiconductor stack package 1100 according to still another embodiment of the present invention includes an integrated substrate 1110, a divided first BOC package 1200, a divided second BOC package 1300 which overlaps a portion thereof and is stacked on the first BOC package 1200 stepwise through an adhesive member 1120, a divided third BOC package 1400 which overlaps a portion thereof and is stacked on the second BOC package 1300 through an adhesive member 1120, an integration wire 1130 configured to electrically connect the first to third packages 1200 to 1400, and an integration protective member 1140 configured to seal the integration wire 1130.

With trends of miniaturization and lightening of electronic products, sizes of package are gradually being reduced. With efforts to develop high-density and high-performance packages, a BGA package in which external electrical connection units of the package are packaged in a grid array type is being introduced.

However, as described above, the BGA semiconductor package has an advantage in that the BGA semiconductor package may appropriately correspond to an increase in the number of input and output pins of the semiconductor chip and may reduce the size of the package to a level of the semiconductor chip while reducing an inductive component of an electrical connection part. On the other hand, when the BGA semiconductor package is mounted on a PCB through solder balls in a method of a surface mounting technology (SMT) type semiconductor package, a solder amount of the solder balls is not uniform and a contact fail may occur. Specifically, when the solder amount of the solder balls is too large, a short circuit may occur between adjacent solder balls in a soldering process.

Figure 13:
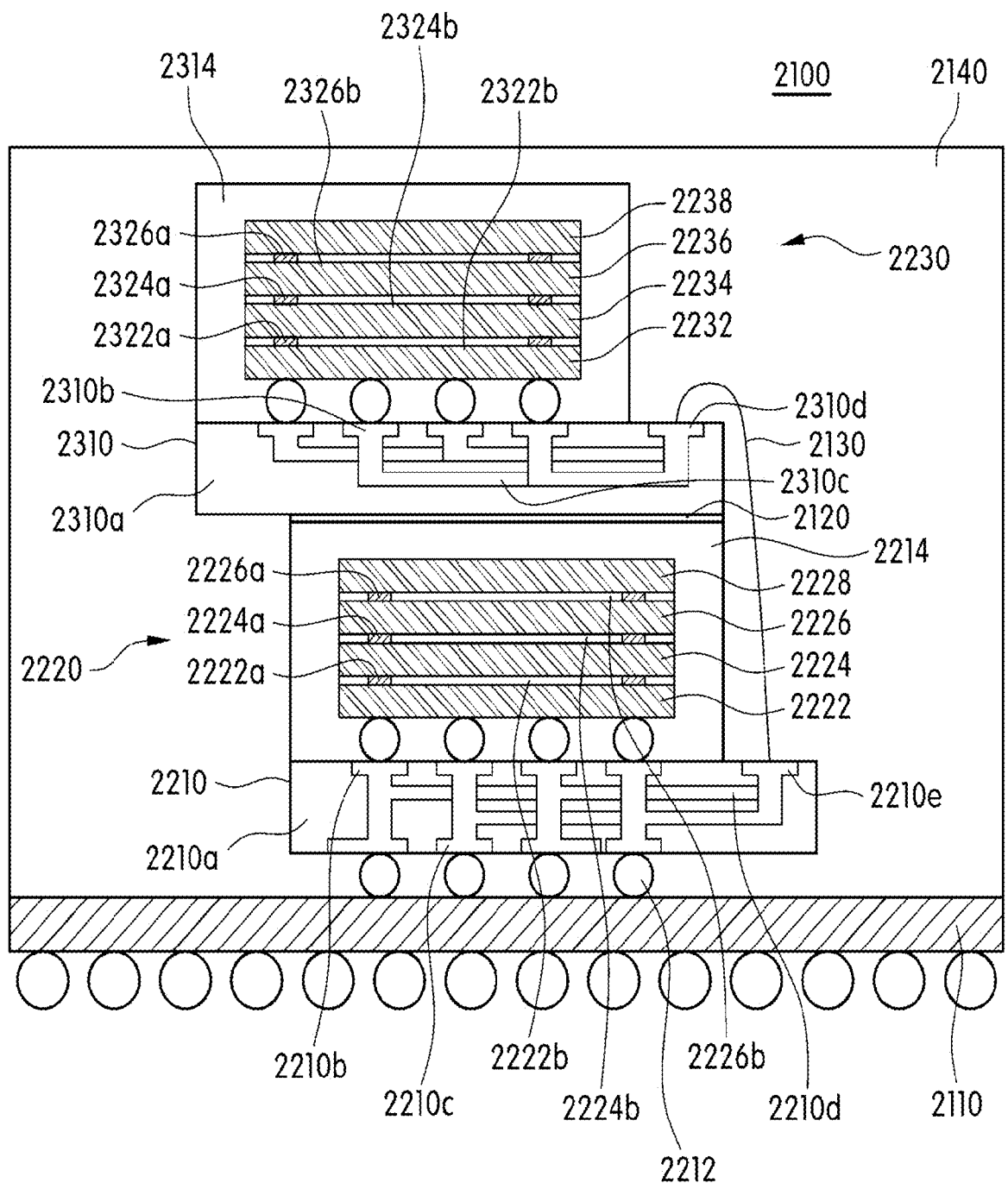
FIG. 13 is a side view illustrating a configuration in which side pads according to the present invention are applied to a BGA semiconductor package.

Referring to FIG. 13, a BGA semiconductor stack package 2100 according to an embodiment of the present invention includes an integrated substrate 2110, a bottom BGA package 2220 stacked on the integrated substrate 2110, a top BGA package 2230 stacked on the bottom BGA package 2220 through an adhesive member 2120, an integration wire 2130 configured to electrically connect the bottom and top BGA packages 2220 and 2230, and an integration protective member 2140 configured to seal the integration wire 2130.

The bottom BGA package 2220 includes a bottom substrate 2210, a plurality of chip pads 2222a, 2224a, and 2226a, which include a plurality of chips 2222, 2224, 2226, and 2228 on the bottom substrate 2210, wherein the memory semiconductor chips 2222, 2224, 2226, and 2228 include an integrated circuit (not illustrated) formed therein and the plurality of chip pads 2222a, 2224a, and 2226a are electrically connected to the integrated circuit, and a plurality of through electrodes (not illustrated) configured to electrically connect the plurality of chip pads 2222a, 2224a, and 2226a. The plurality of chips 2222, 2224, 2226, and 2228 may be stacked through adhesive members 2222b, 2224b, and 2226b.

The plurality of chips 2222, 2224, 2226, and 2228 may include memory semiconductor chips. The memory semiconductor chips may include non-volatile memories and volatile memories that are frequently accessible. For example, the memory semiconductor chips may include flash memory chips, DRAM chips, phase-change memory (PRAM) chips, or combinations thereof.

Solder balls 2212 are formed on a bottom surface of the bottom substrate 2210, and a protective member 2214 configured to cover the plurality of chips 2222, 2224, 2226, and 2228 is formed on an upper surface of the bottom substrate 2210.

The top BGA package 2230 includes a top substrate 2310, a plurality of chip pads 2322a, 2324a, and 2326a, which include a plurality of chips 2322, 2324, 2326, and 2328 on the top substrate 2310, wherein the memory semiconductor chips 2322, 2324, 2326, and 2328 include an integrated circuit (not illustrated) formed therein and a plurality of chip pads 2322a, 2324a, and 2326a are electrically connected to the integrated circuit, and a plurality of through electrodes (not illustrated) configured to electrically connect the plurality of chip pads 2322a, 2324a, and 2326a. The plurality of chips 2322, 2324, 2326, and 2328 may be stacked through adhesive members 2322b, 2324b, and 2326b.

Similarly, the plurality of chips 2322, 2324, 2326, and 2328 may include memory semiconductor chips including a volatile or non-volatile memory.

A protective member 2314 configured to cover the plurality of chips 2322, 2324, 2326, and 2328 is formed on an upper surface of the top substrate 2310. However, solder balls are not formed on a bottom surface of the top substrate 2310 and are omitted.

Specifically, side pads 2310d and 2210e are further included in an edge area of the bottom substrate 2210, which is not covered by the protective member 2214, and an edge area of the top substrate 2310, which is not covered by the protective member 2314, and thus the integration wire 2130 connect between the side pads 2310d and 2210e to electrically connect the top package 2230 to the bottom package 2220.

For example, the top substrate 2310 may include a bare substrate 2310a, connection pads 2310b exposed on an upper surface of the bare substrate 2310a, a rewiring pattern 2310c configured to electrically connect the connection pads 2310b inside the bare substrate 2310a, side pads 2310d connected to the connection pads 2310b through the rewiring pattern 2310c, and a passivation applied to the bare substrate 2310a in order to expose the connection pads 2310b and protect the rewiring pattern 2310c.

The bare substrate 2310a may include a silicon substrate, a glass substrate, or a sapphire substrate. Above all, the bare substrate 2310a may include a flexible substrate.

For example, the bottom substrate 2210 may include a bare substrate 2210a, upper connection pads 2210b exposed on an upper surface of the bare substrate 2210a, lower connection pads 2210c exposed on a bottom surface of the bare substrate 2210a, a rewiring pattern 2210d configured to electrically connect the upper and lower connection pads 2210b and 2210c inside the bare substrate 2210a, side pads 2210e connected to the upper and lower connection pads 2210b and 2210c through the rewiring pattern 2210d, and a passivation (not illustrated) applied to the bare substrate 2210a in order to expose the upper and lower connection pads 2210b and 2210c and protect the rewiring pattern 2210d.

Figure 14:
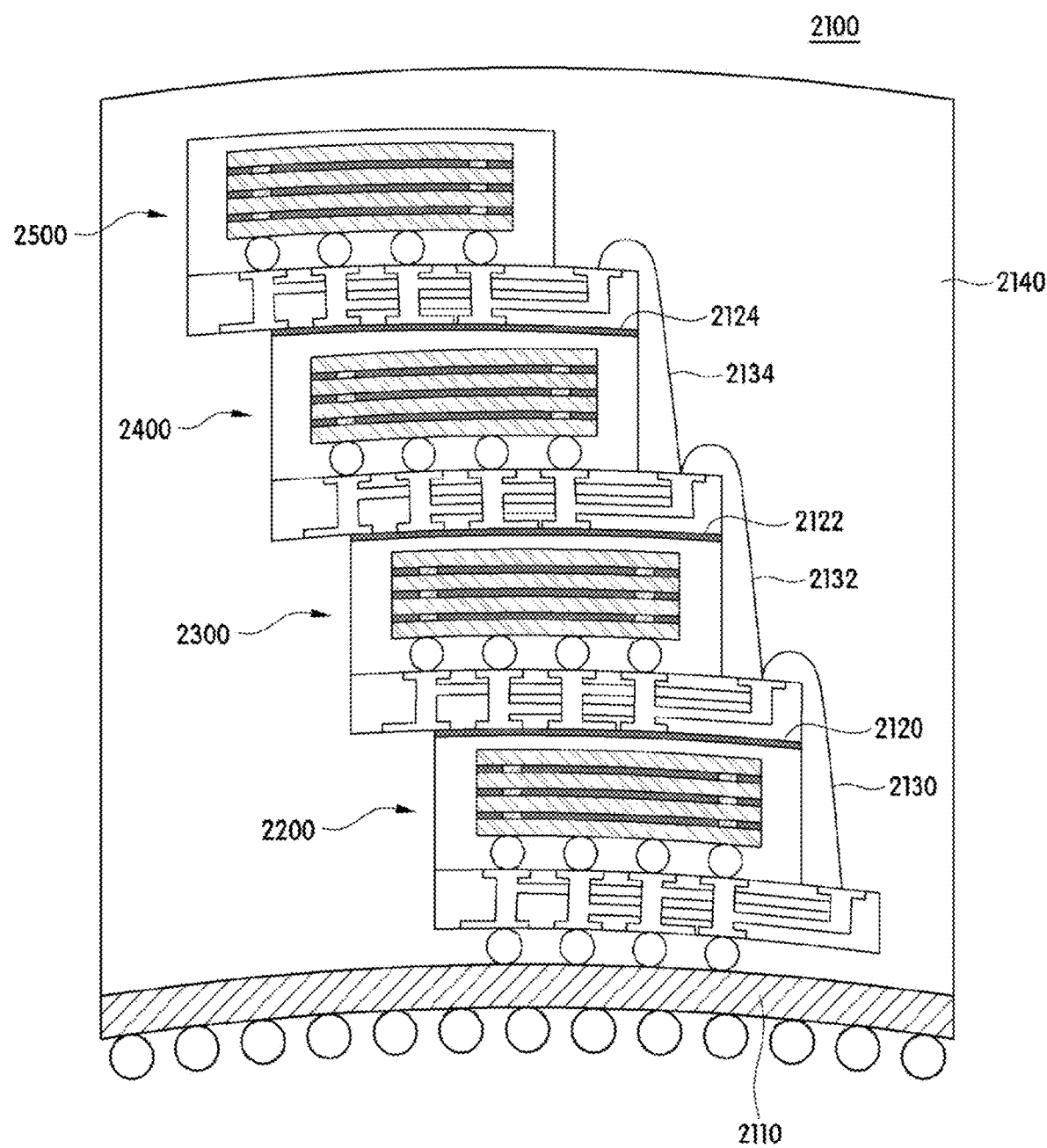
FIG. 14 is a side view illustrating a configuration of a 4-stage flexible semiconductor stack package according to the present invention.

Meanwhile, FIG. 14 illustrates a configuration of a 4-stage semiconductor stack package according to the present invention for constituting a high-density memory module. A corresponding semiconductor stack package may be formed as a flexible package.

Referring to FIG. 14, a 4-stage semiconductor stack package 2100 according to yet another embodiment of the present invention includes an integrated substrate 2110, a first BGA package 2200 staked on the integrated substrate 2110, a second BGA package 2300 staked on the first package 2200 through an adhesive member 2120, a third BGA package 2400 staked on the second package 2300 through an adhesive member 2122, a fourth BGA package 2500 staked on the third package 2400 through an adhesive member 2124, and integration wire 2130 configured to electrically connect the first and second packages 2200 and 2300, an integration wire 2132 configured to electrically connect the second and third packages 2300 and 2400, an integration wire 2134 configured to electrically connect the third and fourth packages 2400 and 2500, and an integration protective member 2140 configured to seal the integration wires 2130, 2132, and 2134.

Figure 15:
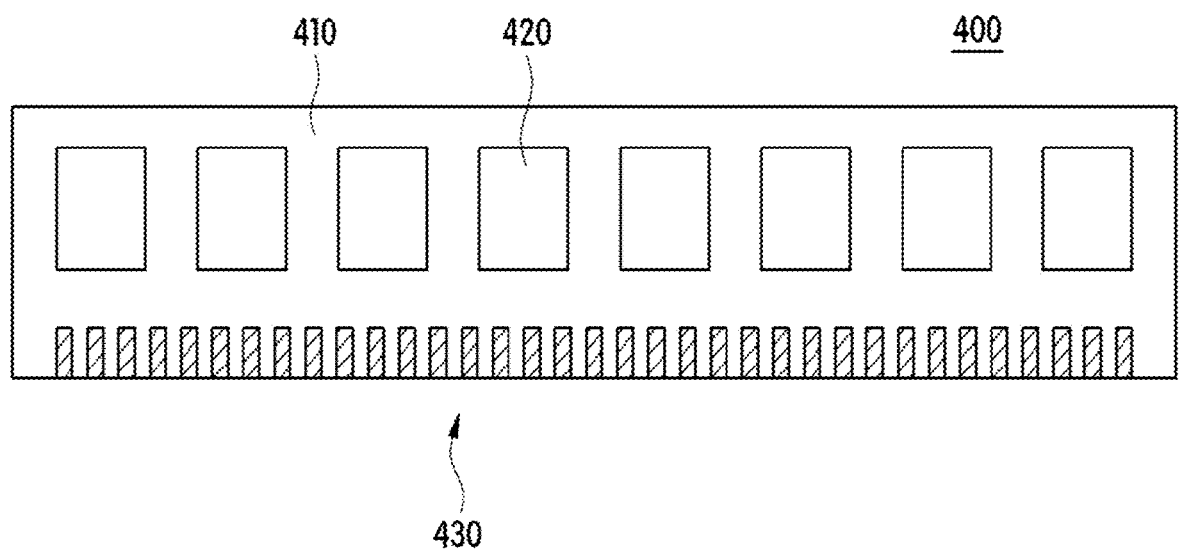
FIG. 15 is a block diagram illustrating a configuration of an electronic circuit device including a high-density memory module to which a dynamic random access memory (DRAM) semiconductor package according to the present invention is applied.

FIG. 15 is a plan view schematically illustrating a configuration of a high-density memory module including DRAM packages according to an embodiment of the present invention.

Referring to FIG. 15, a high-density memory module 400 of the present invention includes a module substrate 410, a plurality of DRAM packages 420 mounted on the module substrate 410, and a plurality of contact terminals 430, which are arranged at one side of the module substrate 410 at regular intervals and electrically connect the DRAM packages 420.

The module substrate 410 may include a PCB substrate. Specifically, the module substrate 410 may include a flexible PCB. Both surfaces of the module substrate 410 may be used. Although eight DRAM packages 420 are illustrated in the drawing, the present invention is not limited thereto. Further, the module substrate 410 may further include a semiconductor package for controlling the DRAM packages 420.

The DRAM package 420 may include at least one of the semiconductor DRAM package 1100, the bottom package 1200, and the top package 1300 according to the present invention.

The contact terminals 430 may include a conductive metal for data input and output. The contact terminals 430 may be variously set according to a standard specification of the high-density memory module 400.

FIG. 16 is a block diagram schematically illustrating a configuration of an electronic circuit device including a high-density DRAM module according to an embodiment of the present invention.

Referring to FIG. 16 an electronic circuit device 500 according to an embodiment of the present invention includes a microprocessor 520 disposed on a circuit board 510, a main memory circuit 530 and a sub memory circuit 540, which communicate with the microprocessor 520, an input signal processing circuit 550 configured to transmit a command to the microprocessor 520, an output signal processing circuit 560 configured to receive a command from the microprocessor 520, and a communication signal processing circuit 570 configured to exchange an electrical signal with other circuit boards. It should be understood that arrows refer to paths through which electrical signals may be transmitted.

The microprocessor 520 may receive and process various electrical signals, output processing results, and control other components of the electronic circuit device 500. The microprocessor 520 may be, for example, a central processing unit (CPU) and/or a main control unit (MCU).

Data that the microprocessor 520 always or frequently needs may be stored in the main memory circuit 530. Since the main memory circuit 530 requires a fast response, the main memory circuit 520 may be formed as a semiconductor memory. More particularly, the main memory circuit 530 may be a semiconductor memory called a cache, and may be formed as a static random access memory (SRAM), a DRAM, a resistive random access memory (RRAM), application semiconductor memories thereof, and other semiconductor memory. In the present embodiment, the main memory circuit 530 may include at least one of the semiconductor DRAM package 1100, the bottom package 1200, and the top package 1300 according to the present invention.

The sub memory circuit 540 may be a mass storage device, and may be a non-volatile semiconductor memory such as a flash memory or a hard disk drive using a magnetic field. The sub memory circuit 540 may include at least one of the semiconductor DRAM package 1100, the bottom package 1200, and the top package 1300 according to the present invention.

The input signal processing circuit 550 may convert an external command into an electrical signal or may transmit an electrical signal transmitted from the outside to the microprocessor 520. The input signal processing circuit 550 may include, for example, a keyboard, a mouse, a touch pad, an image recognition device, or the like. The input signal processing circuit 550 may include at least one of the semiconductor DRAM package 1100, the bottom package 1200, and the top package 1300 according to the present invention.

The output signal processing circuit 560 may be a component for transmitting the electrical signal processed in the microprocessor 520 to the outside. For example, the output signal processing circuit 560 may be a graphic card, an image processor, an optical converter, a beam panel card, various functional interface circuits, or the like. The output signal processing circuit 560 may include at least one of the semiconductor DRAM package 1100, the bottom package 1200, and the top package 1300 according to the present invention.

The communication signal processing circuit 570 is a component for directly transmitting and receiving electrical signals to and from another electronic system or another circuit board without passing through the input signal processing circuit 550 or the output signal processing circuit 560. For example, the communication signal processing circuit 570 may be a modem, a LAN card, or various interface circuits of a personal computer system. The communication signal processing circuit 570 may include at least one of the semiconductor-DRAM package 1100, the bottom package 1200, and the top package 1300 according to the present invention.

As described above, conventionally, a high-capacity memory is implemented through a package on package (PoP) package in which semiconductor dies are individually packaged and tested semiconductor dies are vertically stacked. However, since a yield increases proportionally as the number of stacked dies increases, it can be seen that the present invention is based on the technical concept that the BGA semiconductor package of the present invention is divided and packaged into 4-stage or 8-stage chip stacks, each chip stack is bonded using the side pads on the side surface of the substrate by wire bonding, the chip stacks are integrated again, and thus a 16-stage high-capacity memory is realized. Many other modifications will be possible to those skilled in the art, within the scope of the basic technical idea of the present invention.

INDUSTRIAL APPLICABILITY

The memory package of the present invention is likely to be utilized in a flexible memory package applied to solid-state drive (SSD) products and wearable devices in which high capacity is required. Alternatively, the memory package of the present invention is likely to be utilized in a flexible memory package applied to a wearable device in which high capacity is required.

The invention claimed is:

1. A semiconductor stack package comprising:
an integrated substrate;
a bottom package attached to the integrated substrate;
the bottom package comprises:
a bottom substrate having a window at a center thereof;
a first chip bonded to the bottom substrate so as to face an active surface and having a first bonding pad exposed downward through the window;
a second chip having an inactive surface bonded to an inactive surface of the first chip and an active surface on which a second bonding pad is formed at one side of the active surface;
a first bonding wire through which the first bonding pad is bonded to a bottom surface of the bottom substrate through the window by wire bonding;
a first protective member covering the first bonding wire;
a second bonding wire through which the second bonding pad is bonded to an upper surface of the bottom substrate by wire bonding; and
a second protective member covering the second bonding wire; and
a top package stacked on the bottom package through an adhesive member;
an integration wire electrically connecting the bottom package to the top package; and
an integration protective member to seal the integration wire,
wherein at least one first side pad and at least one second side pad are disposed outside of respective protective members.

2. The semiconductor stack package of claim 1, wherein:
the bottom substrate further includes a side pad in an edge area which is not covered by the second protective member; and
the side pad is connected to the integration wire.

3. A memory module comprising:
a module substrate;
dynamic random access memory (DRAM) packages mounted on the module substrate; and
contact terminals, which are arranged at one side of the module substrate at regular intervals and electrically connect the DRAM packages,
wherein each of the DRAM packages includes:
an integrated substrate;
a bottom package stacked on the integrated substrate
the bottom package comprises:
a bottom substrate having a window at a center thereof;
a first chip bonded to the bottom substrate so as to face an active surface and having a first bonding pad exposed downward through the window;
a second chip having an inactive surface bonded to an inactive surface of the first chip and an active surface on which a second bonding pad is formed at one side of the active surface;
a first bonding wire through which the first bonding pad is bonded to a bottom surface of the bottom substrate through the window by wire bonding;
a first protective member covering the first bonding wire;
a second bonding wire through which the second bonding pad is bonded to an upper surface of the bottom substrate by wire bonding; and
a second protective member covering the second bonding wire; and
a top package stacked on the bottom package through an adhesive member, wherein an edge of a top substrate is exposed without being covered by a top protective member;
an integration wire electrically connecting the bottom package to the top package, wherein the integration wire electrically connects the exposed edge of the bottom substrate to the exposed edge of the top substrate; and
an integration protective member to seal the integration wire,
wherein at least one first side pad and at least one second side pad are disposed outside of respective protective members.

* * * * *